(12) United States Patent
Liu et al.

(10) Patent No.: US 11,335,242 B2
(45) Date of Patent: May 17, 2022

(54) DISPLAY SUBSTRATE AND DISPLAY DEVICE

(71) Applicant: BOE TECHNOLOGY GROUP CO., LTD., Beijing (CN)

(72) Inventors: Dongni Liu, Beijing (CN); Minghua Xuan, Beijing (CN); Liang Chen, Beijing (CN); Detao Zhao, Beijing (CN); Li Xiao, Beijing (CN); Zheng Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/652,535

(22) PCT Filed: Oct. 14, 2019

(86) PCT No.: PCT/CN2019/111021
§ 371 (c)(1),
(2) Date: Mar. 31, 2020

(87) PCT Pub. No.: WO2020/088230
PCT Pub. Date: May 7, 2020

(65) Prior Publication Data
US 2021/0225263 A1 Jul. 22, 2021

(30) Foreign Application Priority Data
Oct. 30, 2018 (CN) .......................... 201811276231.X

(51) Int. Cl.
G09G 3/32 (2016.01)
H01L 25/075 (2006.01)
(Continued)

(52) U.S. Cl.
CPC ........... G09G 3/32 (2013.01); H01L 25/0753 (2013.01); H01L 27/1214 (2013.01);
(Continued)

(58) Field of Classification Search
CPC .............. G09G 3/32; G09G 2330/021; G09G 2320/0233; G09G 2300/0809; H01L 27/1214; H01L 25/0753; H01L 33/62
See application file for complete search history.

(56) References Cited

U.S. PATENT DOCUMENTS 8,836,678 B2 * 9/2014 Uchino ................ G09G 3/3266
345/204
10,256,389 B1 * 4/2019 Zykin ...................... F21K 9/272
(Continued)

FOREIGN PATENT DOCUMENTS

CN 1455632 A 11/2003
CN 101894860 A 11/2010
(Continued)

OTHER PUBLICATIONS

Office Action dated Nov. 19, 2019 issued in corresponding Chinese Application No. 201811276231.X.
(Continued)

Primary Examiner — Vinh T Lam
(74) Attorney, Agent, or Firm — Nath, Goldberg & Meyer; Joshua B. Goldberg

(57) ABSTRACT

The present disclosure provides a display substrate, including: a substrate; a plurality of pixel units on the substrate, each of the pixel units having a light-emitting device therein; a power supply electrode configured to supply a power supply voltage to the light-emitting device, wherein the power supply electrode includes a first electrode layer and a second electrode layer, the second electrode layer has a mesh-shaped structure and is coupled to the first electrode layer through a via hole, and the first electrode layer includes a plurality of first electrode parts spaced apart from each other and each having a block shape, each of the first electrode parts being electrically coupled to a plurality of
(Continued)

light-emitting devices for supplying the power supply voltage to the plurality of light-emitting devices.

13 Claims, 2 Drawing Sheets

(51) Int. Cl.
  *H01L 27/12* (2006.01)
  *H01L 33/62* (2010.01)
(52) U.S. Cl.
  CPC ..... *H01L 33/62* (2013.01); *G09G 2300/0809* (2013.01); *G09G 2320/0233* (2013.01); *G09G 2330/021* (2013.01)

(56) References Cited

U.S. PATENT DOCUMENTS

| | | | |
|---|---|---|---|
| 2005/0162353 A1* | 7/2005 | Kanda | H01L 27/3276 345/76 |
| 2006/0055643 A1* | 3/2006 | Sato | H01L 27/3248 345/82 |
| 2007/0164964 A1* | 7/2007 | Ha | G09G 3/3607 345/98 |
| 2009/0267108 A1* | 10/2009 | Lin | H01L 33/486 257/99 |
| 2010/0097295 A1* | 4/2010 | Kwak | H01L 51/5284 345/32 |
| 2012/0018770 A1* | 1/2012 | Lu | H01L 51/5234 257/99 |
| 2012/0208311 A1* | 8/2012 | Bang | H01L 51/5234 438/34 |
| 2013/0049006 A1* | 2/2013 | Hu | H01L 33/44 257/76 |
| 2013/0176194 A1* | 7/2013 | Jin | H01L 27/3276 345/76 |
| 2014/0062989 A1* | 3/2014 | Ebisuno | G09G 3/3241 345/212 |
| 2014/0184579 A1* | 7/2014 | Kim | G09G 3/3208 345/212 |
| 2014/0346487 A1* | 11/2014 | Asano | G09G 5/00 257/40 |
| 2014/0368416 A1* | 12/2014 | Gu | G09G 3/3258 345/78 |
| 2015/0034981 A1* | 2/2015 | Tamagawa | H01L 25/105 257/93 |
| 2015/0103103 A1* | 4/2015 | Kim | G09G 3/3233 345/690 |
| 2015/0221244 A1* | 8/2015 | Miller | G09F 9/301 705/310 |
| 2015/0248861 A1* | 9/2015 | Kong | G09G 3/3233 345/212 |
| 2015/0364082 A1* | 12/2015 | Gu | G09G 3/3225 345/211 |
| 2016/0012799 A1 | 1/2016 | Kim | |
| 2016/0086547 A1* | 3/2016 | Lebrun | G09G 3/3233 345/205 |
| 2016/0133188 A1* | 5/2016 | Yin | G09G 3/3216 345/76 |
| 2016/0155803 A1 | 6/2016 | Yamazaki et al. | |
| 2016/0172431 A1* | 6/2016 | Huang | H01L 27/3272 257/40 |
| 2016/0365499 A1* | 12/2016 | Francis | H05K 3/0058 |
| 2017/0005247 A1* | 1/2017 | Maki | H01L 33/62 |
| 2017/0140706 A1* | 5/2017 | Song | G09G 3/3233 |
| 2017/0141174 A1* | 5/2017 | Tamonoki | H01L 27/3272 |
| 2017/0207369 A1* | 7/2017 | Itou | H01L 33/486 |
| 2018/0151115 A1* | 5/2018 | Tseng | G09G 3/3266 |
| 2018/0204975 A1* | 7/2018 | Miller | H01L 33/30 |
| 2019/0006454 A1* | 1/2019 | Huang | G09G 3/3258 |
| 2019/0123033 A1* | 4/2019 | Martin | H01L 25/0753 |
| 2020/0144455 A1* | 5/2020 | Son | H01L 33/42 |
| 2020/0161281 A1* | 5/2020 | Hong | H01L 25/0753 |
| 2021/0074895 A1* | 3/2021 | Lee | H01L 25/0753 |

FOREIGN PATENT DOCUMENTS

| | | | | |
|---|---|---|---|---|
| CN | 201820410 U | * | 5/2011 | ........... G09F 9/301 |
| CN | 102916036 A | | 2/2013 | |
| CN | 103745985 A | | 4/2014 | |
| CN | 104156129 A | | 11/2014 | |
| CN | 104200786 A | * | 12/2014 | ........... G09G 3/3648 |
| CN | 105045435 A | | 11/2015 | |
| CN | 105243993 A | | 1/2016 | |
| CN | 205508358 U | | 8/2016 | |
| CN | 106783931 A | | 5/2017 | |
| CN | 107153484 A | | 9/2017 | |
| CN | 207134358 U | | 3/2018 | |
| CN | 108258148 A | | 7/2018 | |
| CN | 109147654 A | | 1/2019 | |
| KR | 20150102788 A | * | 9/2015 | ........... G09G 3/006 |
| KR | 10-2016-0007900 A | | 1/2016 | |
| WO | WO-2019240422 A1 | * | 12/2019 | ........... H01L 33/42 |

OTHER PUBLICATIONS

Office Action dated Aug. 11, 2020 issued in corresponding Chinese Application No. 201811276231 X.

* cited by examiner

DISPLAY SUBSTRATE AND DISPLAY DEVICE

CROSS REFERENCE TO RELATED APPLICATION

This is a National Phase Application filed under 35 U.S.C. 371 as a national stage of PCT/CN2019/111021, filed on Oct. 14, 2019, an application claiming priority to Chinese patent application No. 201811276231.X, filed on Oct. 30, 2018, the entire contents of each of which are incorporated herein by reference.

TECHNICAL FIELD

The present disclosure relates to the field of display technologies, and in particular, to a display substrate and a display device.

BACKGROUND

Light-emitting diodes (LEDs) have been increasingly used in high performance displays as a type of current type light-emitting device. In designing the active-matrix organic light-emitting diode backplane, the main problem to be solved is the non-uniformity of brightness between pixels.

In the applications of a large-size display, since the backplane power line has a certain resistance and the driving current of all pixels is provided by the power supply VDD, the power supply voltage in the region of the backplane close to the power supplying location of the power supply VDD is higher than that in the region far from the power supplying location, and this phenomenon is called IR drop. Since the voltage of the power supply VDD is related to current, IR drop also causes current difference in different regions, thereby generating mura (non-uniform display) during display. In order to reduce IR drop of VDD, a large-area metal layer is added to provide VDD signal, VDD resistance is reduced, and therefore IR drop of VDD is reduced. However, when a large-area metal layer is added to provide VDD signal, the subsequent CVD process may cause arcing discharge due to the accumulation of charges on the large-area metal layer, which may damage the equipment for performing the CVD process.

SUMMARY

The present disclosure provides a display substrate, including: a substrate;

a plurality of pixel units on the substrate, each of the plurality of pixel units having a light-emitting device therein;

a power supply electrode configured to supply a power supply voltage to the light-emitting device, wherein the power supply electrode includes a first electrode layer and a second electrode layer, the second electrode layer has a mesh-shaped structure and is coupled to the first electrode layer through a via hole, and the first electrode layer includes a plurality of first electrode parts spaced apart from each other and each having a block shape; each of the plurality of first electrode parts being electrically coupled to a plurality of light-emitting devices and configured to supply the power supply voltage to the plurality of light-emitting devices.

According to an embodiment of the present disclosure, the display substrate further includes at least one switch element each coupling any two adjacent first electrode parts to each other; and the switch element is configured to be turned off in a fabricating process of the display substrate and turned on so that the first electrode parts are coupled together in a display stage of the display substrate.

According to an embodiment of the present disclosure, each switch element includes a first switch transistor, wherein a first electrode of the first switch transistor is coupled to one of two adjacent first electrode parts, the other of the two adjacent first electrode parts is coupled to a second electrode of the first switch transistor, and a control electrode of the first switch transistor is coupled to a driving chip so as to control on/off state of the first switch transistor through the driving chip.

According to an embodiment of the present disclosure, each of the plurality of pixel units further includes a driving transistor therein, wherein the first electrode part is coupled to a first electrode of the driving transistor in the pixel unit through the second electrode layer.

According to an embodiment of the present disclosure, the first electrode and a second electrode of the driving transistor, the first electrode and the second electrode of the first switch transistor, and the second electrode layer in a same layer and made of a same material, wherein an interlayer insulating layer is between the first electrode layer and the second electrode layer; and the first electrode part is coupled to the second electrode layer through the via hole penetrating the interlayer insulating layer.

According to an embodiment of the present disclosure, the driving transistor has the same switch characteristics as the first switch transistor.

According to an embodiment of the present disclosure, the driving transistor is a P-type transistor, and the first electrode part is an electrode applying the power supply voltage to an anode of the light-emitting device.

According to an embodiment of the present disclosure, the driving transistor is an N-type transistor, and the first electrode part is an electrode applying a power supply voltage to a cathode of the light-emitting device.

According to an embodiment of the present disclosure, the first electrode part includes a Ti/Al/Ti composite film layer.

According to an embodiment of the present disclosure, an orthogonal projection of each of the plurality of first electrode parts on the substrate overlaps with orthogonal projections of multiple pixel units on the substrate.

According to an embodiment of the present disclosure, the first electrode part has a length and a width both less than 5 inches.

According to an embodiment of the present disclosure, the light-emitting device includes Micro LED or mini LED.

The present disclosure also provides a driving method of a display substrate, which is used for driving the display substrate according to the embodiment of the disclosure to display, wherein the at least one switch element is in an on state during display of the display substrate.

The present disclosure provides a display device including a display substrate according to an embodiment of the present disclosure.

DETAILED DESCRIPTION

In order that those skilled in the art will better understand the technical solutions of the present disclosure, the following detailed description will be given with reference to the accompanying drawings and the specific embodiments.

Figure 1:
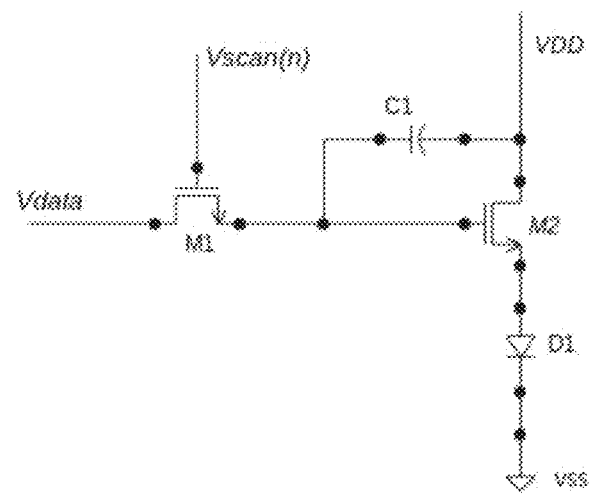
FIG. 1 is a circuit diagram of a pixel driving circuit.

As shown in FIG. 1, there is provided a pixel driving circuit including a switch transistor M1, a driving transistor M2, a storage capacitor C1, and an organic light-emitting device D1. The switch transistor M1 and the driving transistor M2 may be thin film transistors, field effect transistors or other devices having the same characteristics. Since the source and drain electrodes of the used transistors may be interchangeable under certain conditions, the source and the drain electrodes are the same in description of the connection relationship. In an embodiments of the present disclosure, in order to distinguish the source electrode and the drain electrode of the transistor, one of the source electrode and the drain electrode is referred to as a first electrode, the other is referred to as a second electrode, and a gate electrode is referred to as a control electrode.

In addition, the transistors can be classified into N-type transistors and P-type transistors according to their characteristics, and the following embodiments will be described with the switch transistor M1 and the driving transistor M2 as P-type transistors. When a P-type transistor is adopted, the first electrode is the source electrode of the P-type transistor, and the second electrode is the drain electrode of the P-type transistor; when a low level is input to the gate electrode, the source electrode may transfer the power to the drain electrode. The opposite applies to an N-type transistor. Adopting an N-type transistor as the transistor is conceivable for one skilled in the art without creative effort and thus is within the protection scope of the embodiments of the present disclosure.

Meanwhile, the current formula is as follows:

$$I_{oled} = \frac{1}{2}\mu_n C_{ox}\frac{W}{L}(V_{GS} - V_{th})^2; V_{GS} = VDD - Vdata. \text{ where } \frac{1}{2}\mu_n C_{ox}\frac{W}{L}$$

is a constant, $V_{GS}$ is the gate-source voltage, Vdata is a data voltage, and VDD is a power supply voltage.

It can be seen that when the switch transistor M1 and the driving transistor M2 are P-type transistors, the current flowing through the light-emitting device D1 is related to the power supply voltage VDD applied to the anode of the light-emitting device D1. Similarly, when the switch transistor M1 and the driving transistor M2 are N-type transistors, the current flowing through the light-emitting device D1 is related to the power supply voltage VSS applied to the cathode of the light-emitting device D1. The following embodiments are described by taking the case that the switch transistor M1 and the driving transistor M2 are P-type transistors as an example.

When the pixel driving circuit in which the P-type transistors described above are adopted is applied to a pixel unit of a display substrate, a power supply voltage is supplied to the anode of the light-emitting device D1 through a power supply electrode in the display substrate.

According to an embodiment of the present disclosure, in the display substrate including the pixel driving circuit, the power supply voltages supplied to the light-emitting devices in the respective pixel units through the power supply electrode are the same. That is, the power supply electrode is common to the pixel units.

Figure 2:
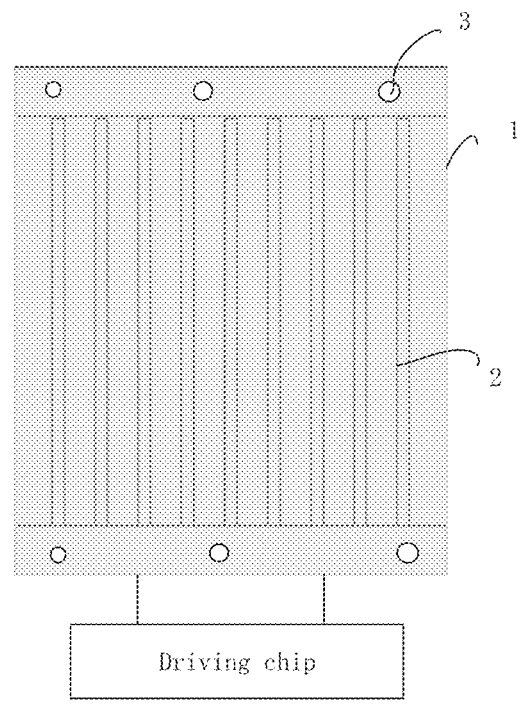
FIGS. 2 and 3 are top views of display substrates of embodiments of the present disclosure.

As shown in FIG. 2, the power supply electrode of the display substrate may include a first electrode layer 1 and a second electrode layer 2. The first electrode layer 1 is coupled to the second electrode layer 2 through via holes 3 disposed in a non-display region of the display substrate. The second electrode layer 2 may be mesh-shaped to be coupled to pixel driving circuits arranged in a matrix. According to an embodiment of the disclosure, the IR drop of the whole display substrate can be reduced by providing the power supply electrodes in two layers.

Figure 3:
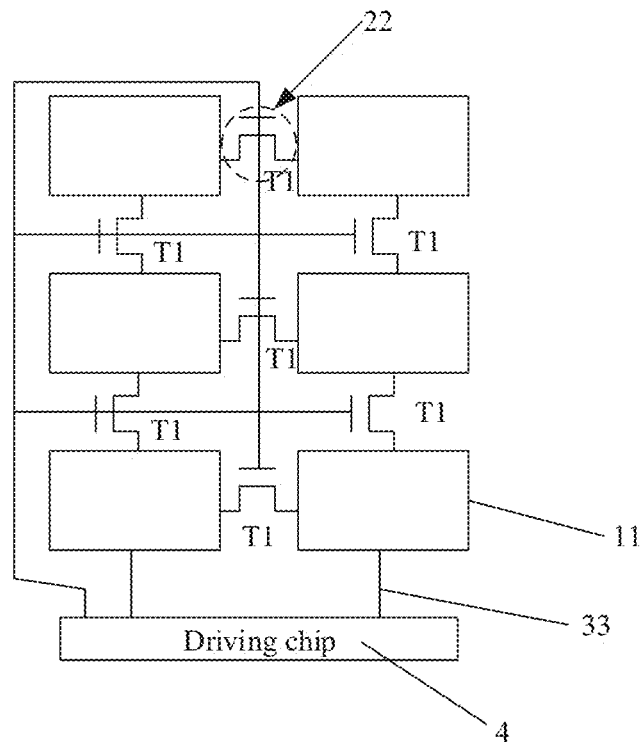

As shown in FIGS. 1 to 3, the present embodiment provides a display substrate including a substrate S1 and a plurality of pixel units on the substrate S1, and each pixel unit includes therein a pixel driving circuit including a switch transistor M1, a driving transistor M2, and a light-emitting device D1. The display substrate further includes a power supply electrode for supplying a power supply voltage (i.e., a driving voltage) to the light-emitting device D1 in the pixel driving circuit. For convenience of explanation, FIG. 3 does not show the second electrode layer. According to an embodiment of the present disclosure, the first electrode layer 1 includes a plurality of first electrode parts 11 spaced apart from each other; and the first electrode parts 11 may be block electrodes. Each of the first electrode parts 11 is electrically coupled to the light-emitting device D1 covered by the first electrode part to supply the driving voltage to the light-emitting device D1 coupled thereto and therefore to generate a driving current.

According to an embodiment of the present disclosure, the first electrode part 11 may cover multiple light-emitting devices D1 to supply a driving voltage to the light-emitting devices D1 coupled thereto and therefore to generate a driving current. The first electrode part 11 corresponds to the light-emitting devices D1 in the pixel units arranged in an array, that is, multiple light-emitting devices D1 are coupled to the same first electrode part 11. In other words, an orthogonal projection of each of the first electrode parts 11 on the substrate overlaps with orthogonal projections of multiple pixel units on the substrate.

Due to the plurality of first electrode parts 11 spaced apart from each other in the embodiment, the problem that when other film layers are formed after the power supply electrode (especially the first electrode layer) is formed, charges are accumulated on a large-area metal layer, and the equipment is damaged due to arcing discharge can be effectively avoided.

The display substrate of the present embodiment further includes a switch element 22 between any two adjacent first electrode parts 11. The switch element 22 is configured to be turned on to couple the respective first electrode parts 11 together in a display stage. That is, a plurality of first electrode parts 11 can be controlled by the same signal in the display stage, so that the wiring of the display substrate can be optimized.

According to an embodiment of the present disclosure, during the fabrication of the display substrate (e.g., during a deposition process), since the plurality of first electrode parts 11 are spaced apart from each other, a phenomenon in which charges are accumulated on a large-area metal layer to cause arcing discharge may be prevented. During the display stage after the deposition process is completed, the switch elements 22 may be turned on to provide a common power supply voltage to the respective pixel driving circuits of the display substrate.

According to an embodiment of the present disclosure, a driving chip 4 may supply the power supply voltage to the first electrode parts 11 via the driving lines 33, and the power supply voltage may be transmitted to the anode of the light-emitting device via the first electrode part 11 to supply the driving voltage to the light-emitting device.

According to an embodiment of the present disclosure, the switch element 22 may be a first switch transistor T1; a first electrode of the first switch transistor T1 is coupled to one of two adjacent first electrode parts 11, the other of the two adjacent first electrode parts 11 is coupled to a second electrode of the first switch transistor T1, and a control electrode of the first switch transistor T1 is coupled to the driving chip 4. The driving chip 4 may supply a voltage for turning on the first switch transistor T1.

According to an embodiment of the present disclosure, the switching characteristics of the first switch transistor T1 are the same as those of the switch transistor M1 and the driving transistor M2 in the pixel driving circuit. That is, the switch transistor M1 and the driving transistor M2 are P-type transistors, and the first switch transistor T1 is also a P-type transistor.

Figure 4:
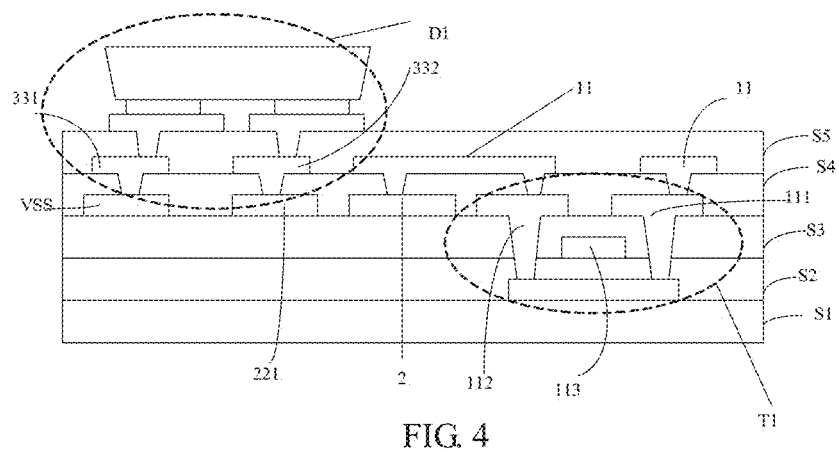
FIG. 4 is a cross-sectional view of a display substrate of an embodiment of the present disclosure.

According to an embodiment of the present disclosure, as shown in FIG. 4, FIG. 4 illustrates a cross-sectional view of the display substrate, and specifically illustrates a connection structure of the light-emitting device D1 and the power supply electrode and a connection structure between the first electrode parts 11. As shown, a cathode 331 of the light-emitting device D1 is applied with the power supply voltage VSS. An anode 332 of the light-emitting device D1 is coupled to the second electrode 221 of the driving transistor M2. The first electrode of the driving transistor M2 may be coupled to the second electrode layer 2, and the first electrode part 11 may be coupled to the second electrode layer 2, and thus, the first electrode part 11 may be coupled to the first electrode of the driving transistor through the second electrode layer 2. The first electrode parts 11 spaced apart from each other may be coupled to the first and second electrodes 111 and 112 of the first switch transistor T1, respectively. A gate electrode 113 of the first switch transistor T1 may be coupled to the driving chip through a connection line. The first and second electrodes of the driving transistor M2, the first and second electrodes of the first switch transistor T1, and the second electrode layer 2 may be disposed in the same layer and made of the same material. An interlayer insulating layer S4 is provided between the first electrode layer 1 and the second electrode layer 2; and the first electrode parts 11 are coupled to the second electrode layer 2 through the via holes penetrating the interlayer insulating layer. This arrangement can simplify the fabrication process of the display substrate and save the cost. It can be understood that the display substrate may further include insulating layers S2, S3, S5 for insulating the metal structures from each other.

In the present embodiment, each first electrode part 11 may be a Ti/Al/Ti (titanium/aluminum/titanium) composite film. The size of each first electrode part 11 is less than 5 inches. That is, the length and width of the first electrode part may be less than 5 inches. Of course, the material and the size of the first electrode part 11 may be determined depending in particular on the size of the display substrate and the capabilities of the deposition equipment. For example, when the size of the first electrode part is 5 inches, the deposition equipment is easily damaged by the arcing discharge of the first electrode part, and thus, the size of the first electrode part may be designed to be less than 5 inches to prevent the deposition equipment from being damaged.

The light-emitting device D1 in the present embodiment includes a Micro LED or a mini LED.

In the related art, the driving current in the Micro LED or mini LED pixel driving circuit is in order of $\mu A$, which is 1000 times that of the organic light-emitting diode, so the voltage drop of the power supply electrode has a large influence on the light-emitting brightness of the Micro LED or mini LED. However, in the embodiments, due to the above improvement, the problem of the voltage drop of the power supply electrode can be alleviated, and the problem of equipment damage caused by arcing discharge due to the accumulation of charges on a large-area metal layer when other film layers are formed after the power supply electrode is formed can be effectively prevented.

It should be noted that, in the display substrate of the present embodiment, the cathode electrode in the pixel driving circuit (i.e., the electrode for applying the power supply voltage to the cathode of the light-emitting device) may be designed to have a structure similar to that of the first electrode part 11. For example, the cathode electrode may be designed to include block electrodes, so that the power consumption of the display substrate can be reduced. When the cathode electrode includes block electrodes, any two adjacent cathode electrodes may also be coupled together through the switch element, and each switch element is controlled through the same control line, so that the control of the cathode electrode and the writing of voltage signals are facilitated.

The embodiment provides a display device including the display substrate according to the embodiment of the disclosure, so that the performance of the display device of the embodiment is excellent.

The display device may be any product or component with a display function, such as an electronic paper, an OLED panel, a mobile phone, a tablet computer, a television, a display, a notebook computer, a digital photo frame and a navigator.

It could be understood that the above implementations are merely exemplary implementations employed to illustrate the principle of the present disclosure, and the present disclosure is not limited thereto. Various variations and improvements can be made by those skilled in the art without departing from the spirit and scope of the present disclosure, and these variations and improvements are also considered to be within the protection scope of the present disclosure.

What is claimed is:

1. A display substrate, comprising:
    a substrate;
    a plurality of pixel units on the substrate, each of the plurality of pixel units having a light-emitting device therein;
    a power supply electrode configured to supply a power supply voltage to the light-emitting device,
    wherein the power supply electrode comprises a first electrode layer and a second electrode layer,
    the second electrode layer has a mesh-shaped structure and is coupled to the first electrode layer through a via hole, and
    the first electrode layer comprises a plurality of first electrode parts spaced apart from each other and each having a block shape, each of the plurality of first electrode parts being electrically coupled to a plurality of light-emitting devices and configured to supply the power supply voltage to the plurality of light-emitting devices, wherein the plurality of first electrode parts are arranged in an array and cover the plurality of pixel units, and wherein the display substrate further comprises at least one switch element, and each of the at least one switch element couples two first electrode parts of the plurality of first electrode parts which are adjacent and separated from each other.

2. The display substrate of claim 1, wherein each switch element comprises a first switch transistor, when viewed in a plan view, a first electrode of the first switch transistor is directly coupled to one of two adjacent first electrode parts, the other of the two adjacent first electrode parts is directly coupled to a second electrode of the first switch transistor, and a control electrode of the first switch transistor is coupled to a driving chip so as to control on/off state of the first switch transistor through the driving chip.

3. The display substrate of claim 2, wherein each of the plurality of pixel units further comprises a driving transistor therein, wherein the first electrode part is coupled to a first electrode of the driving transistor in the pixel unit through the second electrode layer.

4. The display substrate of claim 3, wherein the first electrode and a second electrode of the driving transistor, the first electrode and the second electrode of the first switch transistor, and the second electrode layer in a same layer and made of a same material, and an interlayer insulating layer is between the first electrode layer and the second electrode layer; and the first electrode part is coupled to the second electrode layer through the via hole penetrating the interlayer insulating layer.

5. The display substrate of claim 3, wherein the driving transistor has the same switch characteristics as the first switch transistor.

6. The display substrate of claim 3, wherein the driving transistor is a P-type transistor, and the first electrode part is an electrode applying the power supply voltage to an anode of the light-emitting device.

7. The display substrate of claim 3, wherein the driving transistor is an N-type transistor, and the first electrode part is an electrode applying the power supply voltage to a cathode of the light-emitting device.

8. The display substrate of claim 1, wherein the first electrode part comprises a Ti/Al/Ti composite film layer.

9. The display substrate of claim 1, wherein an orthogonal projection of each of the plurality of first electrode parts on the substrate overlaps with orthogonal projections of multiple pixel units on the substrate.

10. The display substrate of claim 1, wherein the first electrode part has a length and a width both less than 5 inches.

11. The display substrate of claim 1, wherein the light-emitting device comprises Micro LED or mini LED.

12. A driving method of a display substrate, which is used for driving the display substrate of claim 1 to display, wherein the at least one switch element is in an on state during display of the display substrate.

13. A display device, comprising the display substrate of claim 1.

* * * * *